United States Patent [19]
Moore et al.

[11] Patent Number: 6,163,015
[45] Date of Patent: Dec. 19, 2000

[54] SUBSTRATE SUPPORT ELEMENT

[75] Inventors: Gary M. Moore, Los Gatos; Katsuhito Nishikawa, San Jose, both of Calif.; Kazutoshi Inoue, Maebashi, Japan

[73] Assignee: Moore Epitaxial, Inc., San Jose, Calif.

[21] Appl. No.: 09/358,193

[22] Filed: Jul. 21, 1999

[51] Int. Cl.[7] .................................................. A21B 1/00
[52] U.S. Cl. ........................ 219/404; 219/390; 118/729; 392/418
[58] Field of Search ................................... 118/728, 729; 392/418; 219/390, 411, 404

[56] References Cited

U.S. PATENT DOCUMENTS

| | | | |
|---|---|---|---|
| 5,478,399 | 12/1995 | Willard | 118/728 |
| 5,820,685 | 10/1998 | Kurihara et al. | 118/729 |
| 5,848,670 | 12/1998 | Salzman | 187/272 |
| 5,860,640 | 1/1999 | Marochl et al. | 269/289 R |
| 5,882,419 | 3/1999 | Sinha et al. | 118/729 |
| 5,951,776 | 9/1999 | Selyutin et al. | 118/729 |

*Primary Examiner*—Teresa Walberg
*Assistant Examiner*—Shawntina T. Fuqua
*Attorney, Agent, or Firm*—Forrest Gunnison; Gunnison, McKay & Hodgson, LLP

[57] ABSTRACT

A self-aligning mating structure of a substrate support element is connected to an alignment guide. The combination of the self-aligning mating structure and the alignment guide assures that the element properly seats in a complementary mating structure shaped opening in a susceptor as the susceptor is moved into the processing position. An end of the substrate support element opposite to and removed from the self-aligning mating structure is weighted. Thus, the substrate support element remains properly seated in the susceptor throughout the process cycle. The end of the substrate support element opposite to and removed from the self-aligning mating structure also includes a support structure. As the susceptor is lowered from the processing position to the load/unload position, the support structure contacts the bottom of the reaction chamber or other surface in the reaction chamber. As the susceptor is lowered further, the self-aligning mating structure that includes a substrate support tab is positioned above and separated from the susceptor.

8 Claims, 7 Drawing Sheets

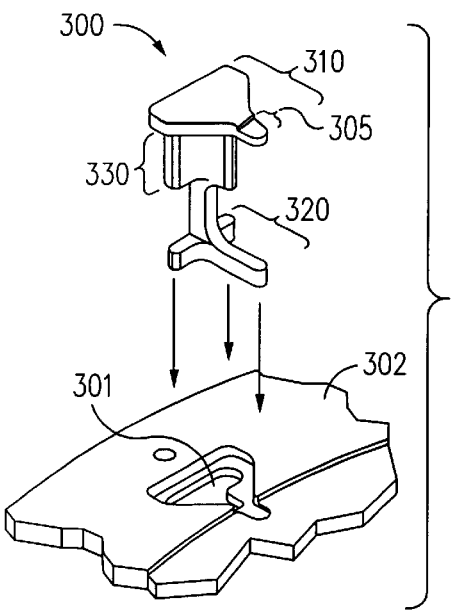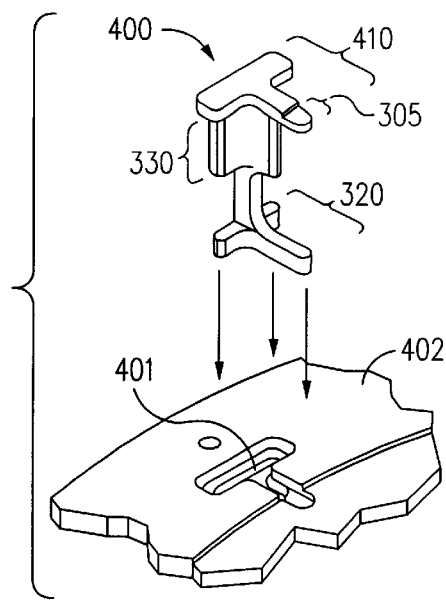
FIG. 3A	FIG. 4A
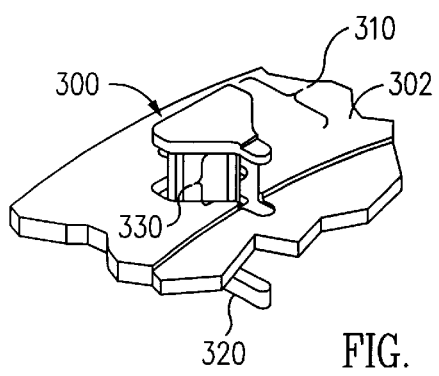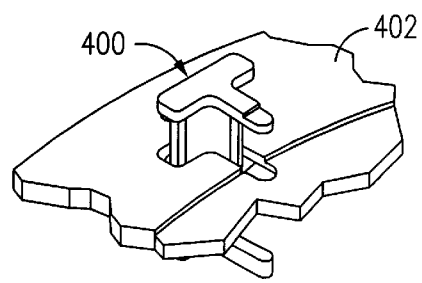
FIG. 3B	FIG. 4B
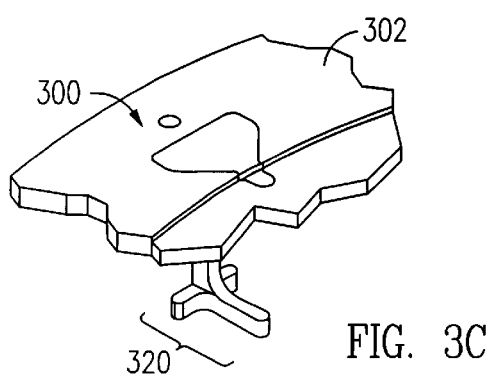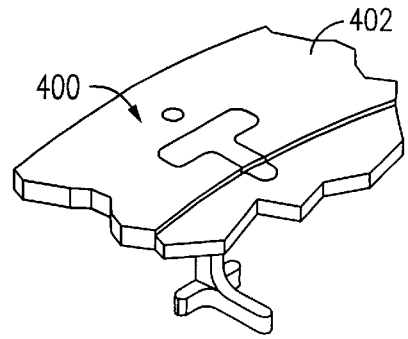
FIG. 3C	FIG. 4C

SUBSTRATE SUPPORT ELEMENT

FIELD OF THE INVENTION

This invention relates generally to reactors for processing semiconductor substrates, and more particularly, to a mechanism for lifting a substrate above a susceptor.

BACKGROUND OF THE INVENTION

A variety of reactors has been used to process semiconductor substrates. For modern high throughput reactors, a robot is used to load and unload substrates in a reactor. To facilitate loading and unloading, substrate support pins were used in the susceptor. In an RTP reactor, such as that described in U.S. Pat. No. 5,710,407, which is incorporated herein by reference in its entirety, pins 101A and 101B (FIGS. 1A and 1B) were mounted in susceptor 102. Each of pins 101A and 101B had a tapered surface that mated with a complementary tapered surface of an opening through susceptor 102. Several mounting rods 112A and 112B were placed in the bottom of the reaction chamber 110.

When susceptor 102 was in the processing position as shown in FIG. 1A, wafer support pins 101A and 101B were seated in the susceptor openings. This prevented gas flow through the opening in the susceptor and thus prevented backside depositions.

To lift a wafer, susceptor 102 was positioned so that wafer support pins 101A and 101B were positioned above mounting rods 112A and 112B, respectively. Susceptor 102 was lowered and mounting rods 112A and 112B entered the holes in susceptor 102 from the backside and engaged wafer support pins 101A and 101B, respectively, as shown in FIG. 1B. As susceptor 102 was lowered further, wafer support pins 101A and 101B could not move lower because pins 101A and 101B were held in place by mounting rods 112A and 112B. Consequently, wafer support pin 101A and 101B held wafer 111 above susceptor 102 so that a robot could access wafer 111.

While this configuration was a significant advance over other techniques in use, the method required alignment of mounting rods 112A and 112B with the through holes in susceptor 102. Also, sometimes one or more of substrate support pins 101A and 101B did not seat properly in the susceptor opening and permitted gas flow through the opening. This resulted in a backside deposition. Since the pin was located under the wafer, the discontinuity introduced by the pin affected the uniformity of the heat distribution.

An alternative design eliminated the need for the alignment, and eliminated the heat distribution issues. In this design, the mounting rod was eliminated, and a rod was formed as a part of substrate support pin 201, as illustrated in FIG. 2A. The location of the substrate support pins was moved from under the substrate into a substrate surround ring. Thus, when the susceptor was lowered, the rod portion of each of substrate support pins 201A to 201D contacted the bottom of the reaction chamber and lifted substrate surround ring 210, and consequently the substrate above the rest of the susceptor as shown in FIG. 2B. A more complete description of FIGS. 2A and 2B is given in U.S. Pat. No. 5,820,686, which is incorporated herein by reference in its entirety.

While this design was an improvement over the design in FIGS. 1A and 1B, one or more of substrate support pins 201A to 201D sometimes did not seat properly in the susceptor, and so the substrate surround ring and consequently the supported substrate was not in the same plane as other substrates on the susceptor. If only a single substrate was being processed, the substrate was not level. In both cases, gas flowed unto the backside of the substrate, and process uniformity on the topside of the substrate was affected by the tilt introduced by the failure of the substrate support pin to seat properly. Both of these effects are undesirable. Thus, while substrate support pins 201A to 201D improved process uniformity over pins 101A and 101B, pins 201A to 201D are still a factor that can limit the overall process uniformity from wafer to wafer within a batch as well as from batch to batch whenever any one of the pins does not seat properly during the process cycle.

SUMMARY OF THE INVENTION

According to the principles of this invention, a novel substrate support element eliminates the problems of the prior art substrate support pins. A self-aligning mating structure of the substrate support element is connected to an alignment guide. The combination of the self-aligning mating structure and the alignment guide assures that the element properly seats in a complementary mating structure shaped opening in the susceptor as the susceptor is moved into the processing position.

An end of the substrate support element opposite to and removed from the self-aligning mating structure is weighted. Thus, the substrate support element remains properly seated in the susceptor throughout the process cycle as the susceptor rotates.

The weighted end of the substrate support element opposite to and removed from the self-aligning mating structure also functions as a support structure. As the susceptor is lowered from the processing position to the load/unload position, the support structure contacts the bottom of the reaction chamber, or another structure in the reaction chamber. As the susceptor is lowered further, the self-aligning mating structure that includes a substrate support tab is positioned above and separated from the susceptor.

In one embodiment, the support structure contacts the reaction chamber bottom or other structure at a plurality of points. Consequently, the substrate support element cannot be cocked and is moved upward in a substantially vertically direction as the susceptor lowers. The alignment guide of the substrate support element assists in maintaining the upward motion in a vertical direction relative to the top of the susceptor, and prevents the substrate support element from tipping as the element is moved upward with respect to the susceptor. This prevents the substrate from becoming wedged in place between the plurality of substrate support elements holding the substrate in the load/unload position.

In addition, the substrate support element eliminates the need for a substrate surround ring to lift the substrate, and so removes a discontinuity in the susceptor which in turn improves the temperature uniformity within the susceptor from batch to batch. This is because the temperature distribution of the susceptor is no longer affected by any gap between the substrate surround ring and any surrounding portion of the susceptor. The improved temperature uniformity within the susceptor from batch to batch assists in maintaining a more uniform temperature across the substrate from batch to batch which in turn results in more uniform processing from batch to batch.

BRIEF DESCRIPTION OF THE DRAWINGS

FIG. 3A is an assembly diagram of a first embodiment of a substrate support element according to the principles of this invention.

FIG. 3B is an illustration of the first embodiment of the substrate support element of this invention in a load/unload position.

FIG. 3C is an illustration of the first embodiment of the substrate support element of this invention in a processing position.

FIG. 4A is an assembly diagram of a second embodiment of a substrate support element according to the principles of this invention.

FIG. 4B is an illustration of the second embodiment of the substrate support element of this invention in a load/unload position.

FIG. 4C is an illustration of the second embodiment of the substrate support element of this invention in a processing position.

In the following description, elements with the same reference numeral are the same element. Also, the first digit of each element's reference numeral indicates the Figure number in which that element first appeared.

DETAILED DESCRIPTION OF THE INVENTION

Figure 1A:
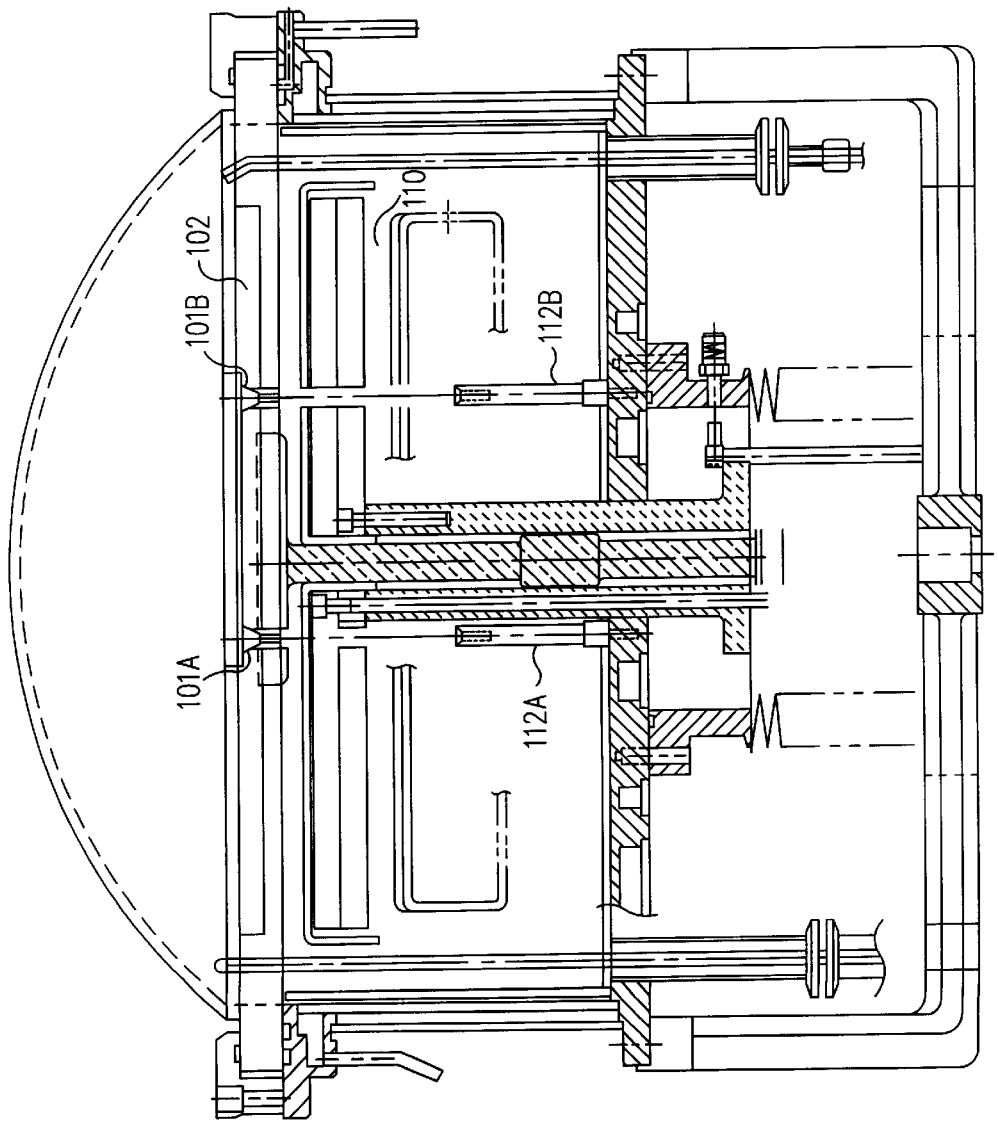
FIG. 1A is a diagram of a prior art substrate support pin configuration in a processing position.
Figure 1B:
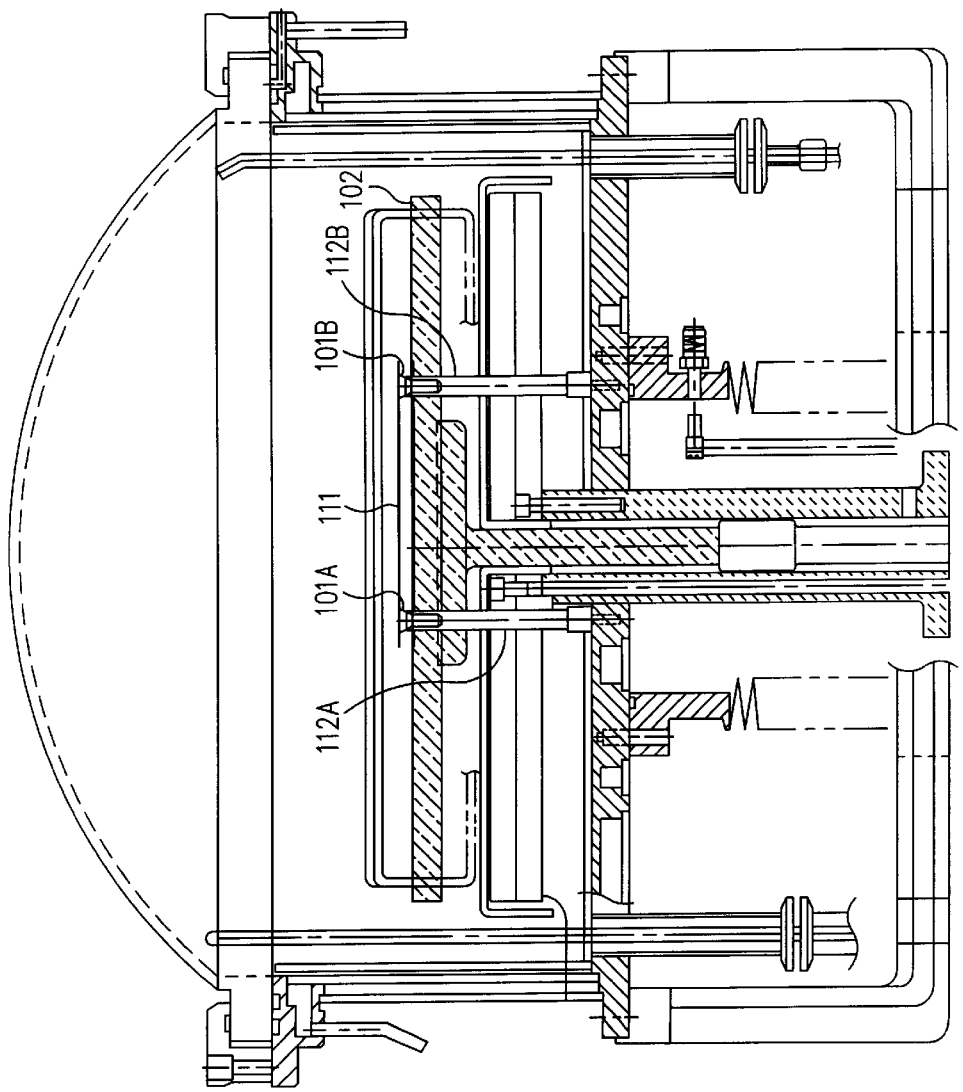
FIG. 1B is a diagram of the prior art substrate support pin configuration of FIG. 1A in a load/unload position.
Figure 2A:
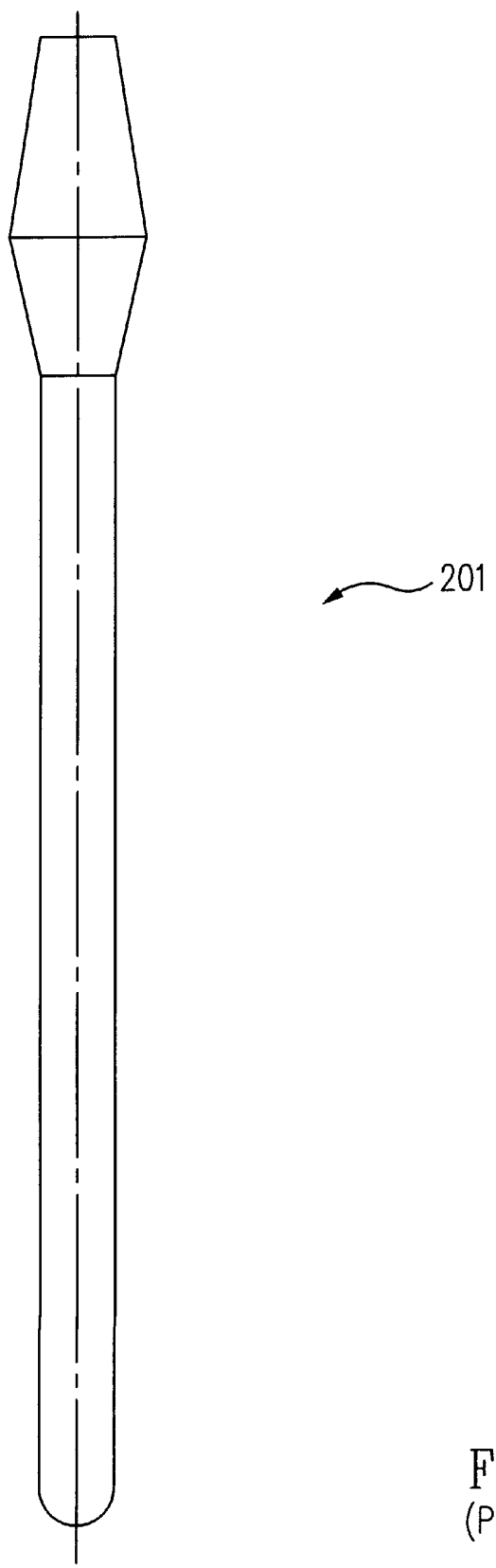
FIG. 2A is a diagram of another prior art substrate support pin.
Figure 2B:
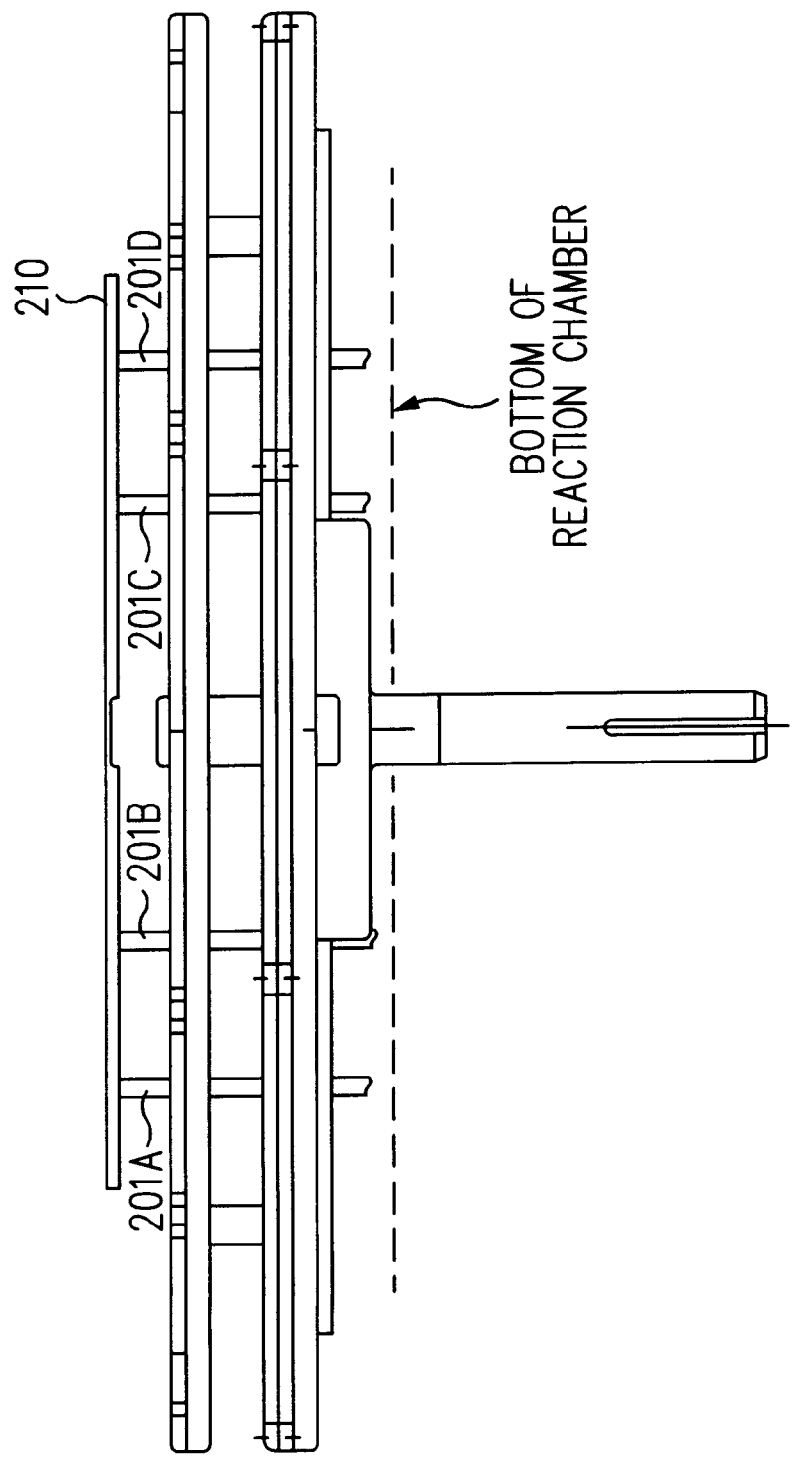
FIG. 2B is a diagram of the prior art substrate support pin of FIG. 2A in a load/unload position.

In accordance with the present invention, a substrate support element 300 (FIG. 3A) allows easy loading and unloading of a substrate on and from susceptor 302. (In FIGS. 3A to 3C, only a small portion of susceptor 302 is illustrated.) As used herein, a susceptor is any type of a heat stabilizer, used in substrate processing, in which the support elements of this invention can be incorporated.

Substrate support element 300 is inserted into an opening 301 in susceptor 302. A first portion 310 of substrate support element 300, sometimes called a self-aligning mating structure, includes a lift tab 305.

In a first position, which is a loading and unloading position as illustrated in FIG. 3B, a second portion 320, sometimes called a weighted contact structure and sometimes a support and stabilizer section, contacts a surface in the reactor reaction chamber. In the embodiment illustrated, the support and stabilizer section 320 includes a plurality of contacts.

As susceptor 302 is lowered, the contact of the plurality of contacts of section 320 with the reaction chamber surface prevents the further downward movement of substrate support element 300, and so first portion 310 is positioned above an upper surface of susceptor 302. Consequently, a substrate (not shown) resting on lift tab 305 is positioned above susceptor 302. This permits easy removal of the substrate and placement of another substrate on lift tab 305, i.e., easy unloading/loading.

After removal of one substrate and placement of another substrate, susceptor 302 is raised to a second position as illustrated in FIG. 3C. As susceptor 302 is moved to the second position, alignment guide 330 positions substrate support element 300 within opening 301 so that self-aligning mating structure 310 mates with the complementary shaped portion of susceptor 302 so as to seal the opening and minimize gas flow through opening 301. In particular, in one embodiment, self-aligning mating structure 310 has a tapered edge surface about its periphery that contacts a complementary tapered edge surface of susceptor 302.

In addition, the relationship between self-aligning mating structure 310 and the complementary shaped portion of susceptor 302 is such that substrate support element 300 cannot only partially seat. Consequently, substrate support element 300 cannot be tilted in the processing position, which in turn prevents element 300 from causing the supported substrate to be tilted with respect to the top surface of susceptor 302. As susceptor 302 is rotated during processing, the weight of section 320 helps to keep element 300 properly seated in susceptor 302.

Substrate support element 400 (FIGS. 4A to 4C) is similar to substrate support element 300 except self-aligning mating structure 410 is of a different shape. This demonstrates that in general the self-aligning mating structure can have any desired shape so long as substrate support tab 305 can extend from one side of the shape.

Self-aligning mating structure 310 has a first polygonal surface 501 (FIG. 5) having a first area. A second surface 505 that defines an upper surface of lift tab 305 is substantially parallel to first polygonal surface 501. A rim edge surface 504 connects one side of first polygonal surface 501 to second surface 505. The depth of the pocket in the susceptor determines the height of rim edge surface 504.

A third surface 502 is opposite and removed from both surfaces 501 and 505. A beveled perimeter edge surface 503 connects an outer perimeter of surfaces 501 and 505 to a perimeter of third surface 502. All corners of surfaces 501, 502, and 505 that contact beveled edge surface 503 are rounded to facilitate mating with complementary beveled edge surface 551 in susceptor 302.

In this embodiment, alignment guide 330 is fixedly attached to surface 502. Alignment guide 330 has a T-shape when viewed from the top. Edge end surfaces 531, 532, and 533 (not shown) of the T-shape that are substantially perpendicular to surface 502 are beveled to facilitate both alignment and movement of substrate support element 300 through susceptor 302. Alternatively, these edge surfaces could be rounded. However, in this embodiment, corresponding edge surfaces 561, 562, and 563, respectively, in susceptor 302 are rounded. The combination of the rounded edge surfaces in susceptor opening 301 and the beveled edge surfaces for alignment guide 330 assures proper alignment and reduces frictional forces compared to the use of rounded edge surfaces for alignment guide 330 with comparable clearances through the susceptor opening.

In one embodiment (not shown) alignment guide 330 extends to support and stabilizer structure 320. In another embodiment (not shown), only the crossbar of the T-shaped alignment guide and not the leg portion of the T-shape extends to support and stabilizer section 320.

In this embodiment, a solid beam 340 connects alignment guide 330 to support and stabilizer section 320. The length of beam 340 is adjusted so that support and stabilizer section 320 does not contact anything within the reaction chamber other than susceptor 302, when susceptor 302 is in the processing position, and so that the substrate is a desired distance above susceptor 302 when susceptor 302 is in the load/unload position.

As indicated above, when susceptor 302 is in the processing position, support and stabilizer section 320 functions as a stabilizer by providing weight that holds self-aligning mating structure 310 in the complementary shaped opening in susceptor 302. In this embodiment, support and stabilizer section 320 is T-shaped with a cross-bar portion 521 of the T-shape having beveled end edge surfaces similar to those of alignment guide 330. In this embodiment, each of the edge surfaces of crossbar portion 521 that are perpendicular to surface 502 lays in the same plane as the corresponding edge of alignment guide 330. A bottom 523 of leg portion 522 of the T-shape is substantially aligned with tab 305 so that a line tangent to tab 305 is also tangent to the bottom 523.

The shape of support and stabilizer section 320 and the number of contacts is only illustrative and is not intended to limit the invention to the particular shape illustrated. In view of this disclosure, any desired shape that accomplishes the support and stabilization function can be used. In this embodiment, the substrate support element is machined from a single piece of graphite that is silicon carbide coated.

The positioning of the plurality of contacts is selected so that as support and stabilizer section 320 contacts the reaction chamber surface, substrate support element 300 does not tilt. Of course, instead of a plurality of contacts, a surface could be used. For example, an annular structure with a flat edge surface that contacted the reaction chamber surface could be used. The annular structure would be coupled to beam 340 by a plurality of ribs. The particular implementation of the support and stabilizer section 320 is selected based upon the structures inside the reaction chamber and the shape of the area of the reaction chamber bottom or other surface that contacts section 320.

Figure 5:
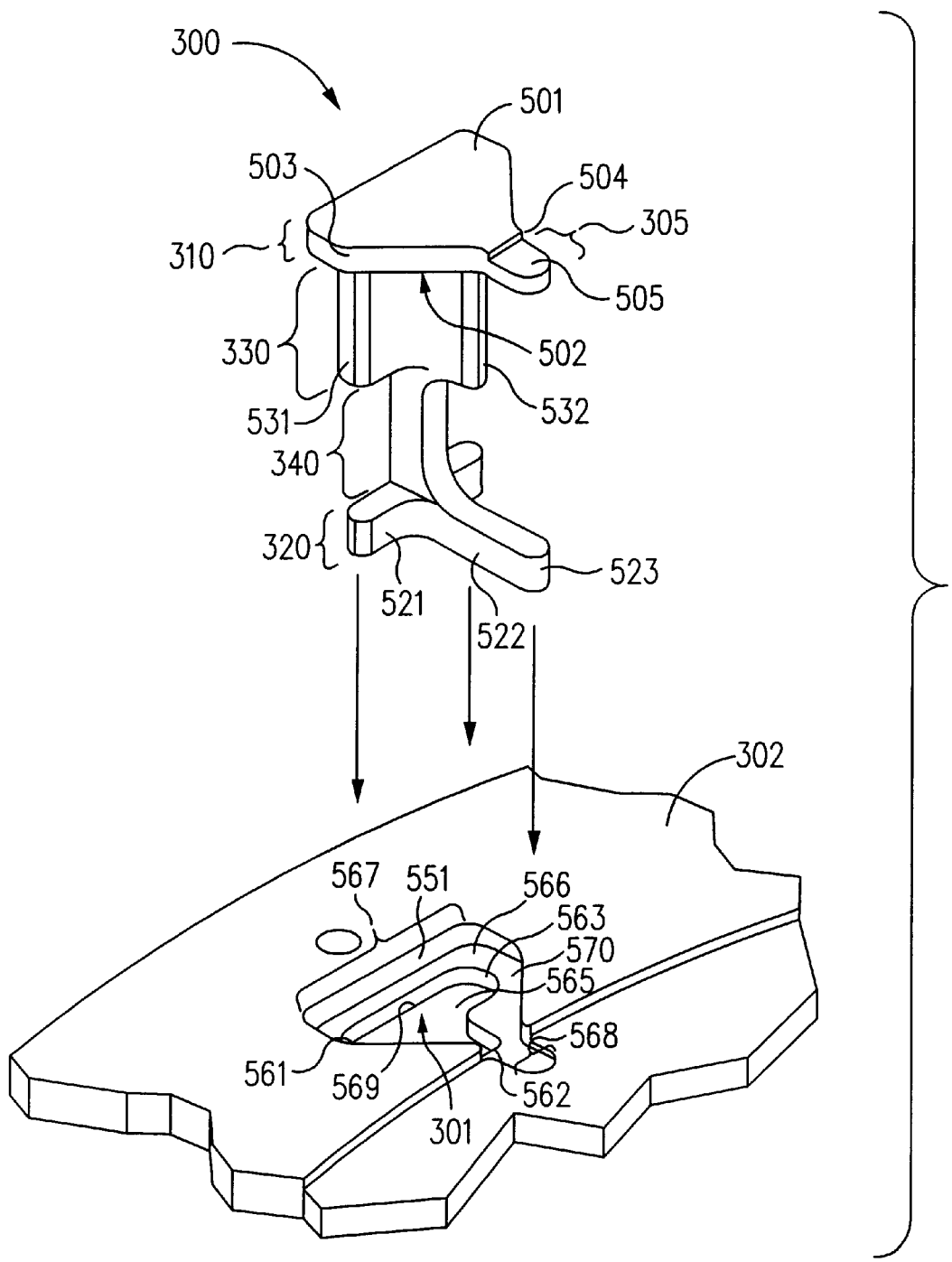
FIG. 5 is an enlarged view of FIG. 3A.

As illustrated in FIG. 5, opening 301 has a guide opening 565, and an alignment and mating opening 566. Alignment and mating opening 566 has a perimeter defined by complementary beveled edge surface 551.

A top portion 567 of alignment and mating opening 566 is in the same plane as an upper surface of susceptor 302. A top of a tab portion 568 of alignment and mating opening 566 is in the same plane as the top of the substrate support region of susceptor 302. A shelf 570 defines a bottom of alignment and mating opening 566 and a top of guide opening 565.

A perimeter of guide opening 565 is defined by guide edge surface 569 that has a shape that is substantially the same as the shape of alignment guide 330 with the exception of edge surface portions 561, 562 and 563 described above.

Figure 6:
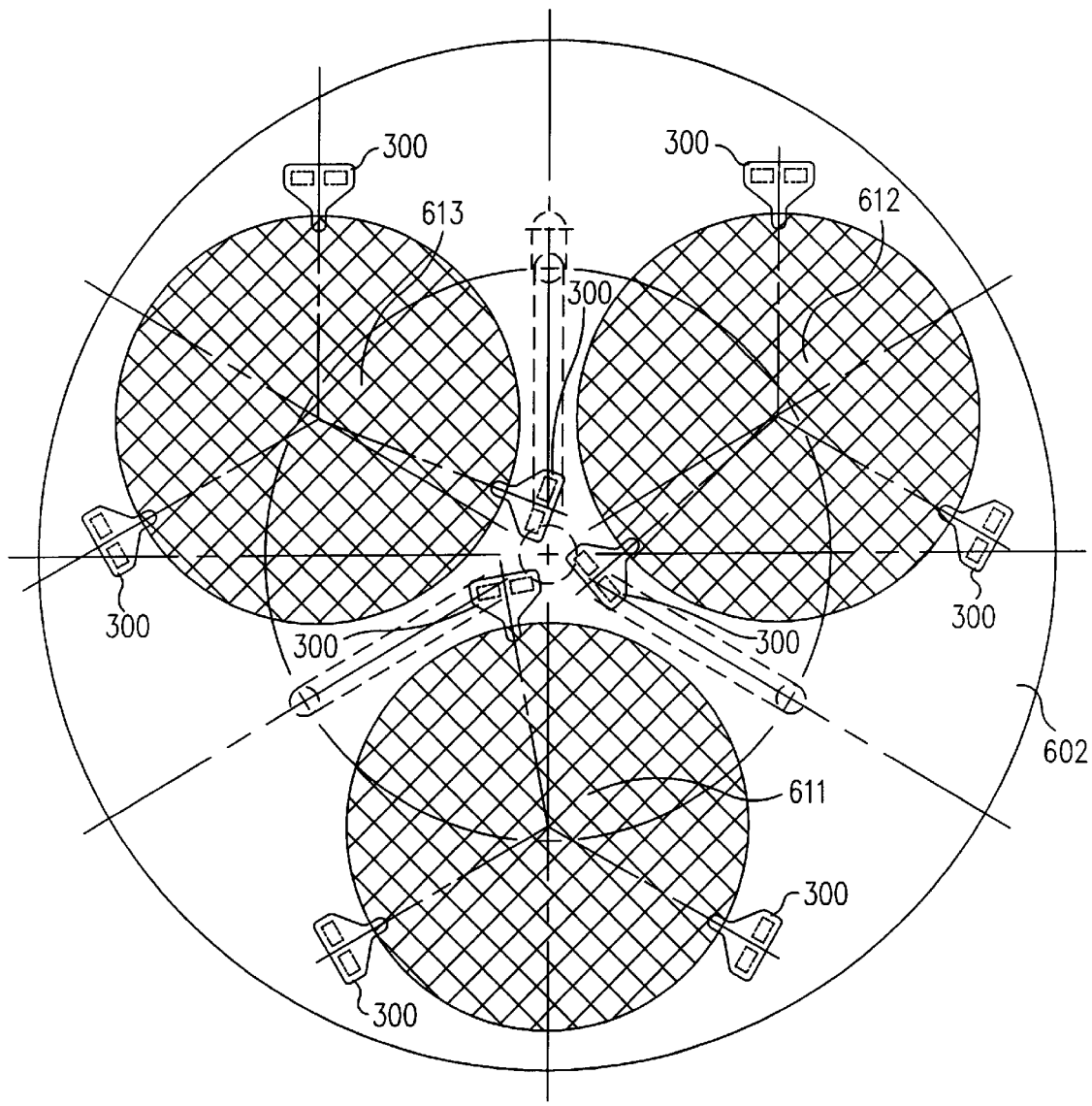
FIG. 6 is a top view of a susceptor that supports a plurality of substrates and uses a plurality of substrate support elements of this invention.

FIG. 6 is a top view of one embodiment of a susceptor 602 that supports a plurality of substrates. In this embodiment, three substrate pockets 611 to 613 are formed in susceptor 602. Located about each of pockets 611 to 613 is a plurality of substrate support elements of this invention. Each of the substrate support elements is substrate support element 300.

While in this embodiment, three substrate support elements are utilized about each substrate pocket; this is illustrative only and is not intended to limit the invention to the specific configuration shown. In view of this disclosure, a plurality of substrate support elements can be used, where the number in the plurality depends both on the size of the substrate and the number of substrates place on the susceptor.

The drawings and the forgoing description gave examples of the present invention. The scope of the present invention, however, is by no means limited by these specific examples. Numerous variations, whether explicitly given in the specification, such as differences in structure, dimension, and use of material, are possible. The scope of the invention is at least as broad as given by the following claims.

We claim:

1. A substrate support element comprising:
    a self-aligning mating structure including:
        a substrate lift tab;
        a first polygonal surface;
        a second surface that defines an upper surface of said lift tab wherein said second surface is substantially parallel to said first polygonal surface; and
        a rim edge surface connecting a side of said first polygonal surface to said second surface; and
    an alignment guide attached to said self-aligning mating structure.

2. The substrate support element of claim 1 further comprising:
    a support and stabilizer element connected to said alignment guide.

3. The substrate support element of claim 1 wherein said self-aligning mating structure further comprises a beveled perimeter edge surface about said first and second surfaces.

4. The substrate support element of claim 1 wherein at least a portion of said alignment guide is substantially T-shaped in a plane parallel to said first polygonal surface.

5. The substrate support element of claim 3 wherein at least a portion of said alignment guide is substantially T-shaped in a plane parallel to said first polygonal surface.

6. The substrate support element of claim 1 wherein said substrate support element is mounted in an opening in a susceptor.

7. The substrate support element of claim 2 wherein said support and stabilizer element further comprises a plurality of contacts.

8. The substrate support element of claim 7 wherein said plurality of contacts of said support and stabilizer element is three contacts.

* * * * *